United States Patent
Lan et al.

(10) Patent No.: US 9,922,956 B2
(45) Date of Patent: Mar. 20, 2018

(54) MICROELECTROMECHANICAL SYSTEM (MEMS) BOND RELEASE STRUCTURE AND METHOD OF WAFER TRANSFER FOR THREE-DIMENSIONAL INTEGRATED CIRCUIT (3D IC) INTEGRATION

(71) Applicant: QUALCOMM Incorporated, San Diego, CA (US)

(72) Inventors: Je-Hsiung Jeffrey Lan, San Diego, CA (US); Wenyue Zhang, San Diego, CA (US); Yang Du, Carlsbad, CA (US); Yong Ju Lee, San Diego, CA (US); Shiqun Gu, San Diego, CA (US); Jing Xie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/498,965

(22) Filed: Sep. 26, 2014

(65) Prior Publication Data

US 2016/0093591 A1    Mar. 31, 2016

(51) Int. Cl.
*H01L 25/065* (2006.01)
*H01L 21/02* (2006.01)
*H01L 21/265* (2006.01)
*H01L 21/683* (2006.01)
*H01L 21/762* (2006.01)
*H01L 21/768* (2006.01)
(Continued)

(52) U.S. Cl.
CPC .... *H01L 25/0657* (2013.01); *H01L 21/02164* (2013.01); *H01L 21/265* (2013.01); *H01L 21/6835* (2013.01); *H01L 21/76254* (2013.01); *H01L 21/76802* (2013.01); *H01L 21/76877* (2013.01); *H01L 21/8221* (2013.01); *H01L 23/528* (2013.01); *H01L 23/5226* (2013.01); *H01L 25/50* (2013.01); *H01L 27/0688* (2013.01); *H01L 2221/68318* (2013.01); *H01L 2221/68363* (2013.01); *H01L 2221/68381* (2013.01); *H01L 2225/06541* (2013.01); *H01L 2924/0002* (2013.01)

(58) Field of Classification Search
CPC ......... H01L 27/14603; H01L 27/14687; H01L 31/1013; H01L 27/14601; H01L 27/14609
See application file for complete search history.

(56) References Cited

U.S. PATENT DOCUMENTS 8,633,554 B2    1/2014   Chu et al.
8,709,849 B2    4/2014   Cheng et al.
(Continued)

OTHER PUBLICATIONS

Niklaus F., et al., "Wafer bonding with nano-imprint resists as sacrificial adhesive for fabrication of silicon-on-integrated-circuit (SOIC) wafers in 3D integration of MEMS and ICs," Sensors and Actuators A: Physical, 2009, vol. 154 (1), pp. 180-186.
(Continued)

*Primary Examiner* — Tony Tran
(74) *Attorney, Agent, or Firm* — Muncy, Geissler, Olds & Lowe, P.C.

(57) ABSTRACT

A microelectromechanical system (MEMS) bond release structure is provided for manufacturing of three-dimensional integrated circuit (3D IC) devices with two or more tiers. The MEMS bond release structure includes a MEMS sacrificial release layer which may have a pillar or post structure, or alternatively, a continuous sacrificial layer for bonding and release.

19 Claims, 19 Drawing Sheets

(51) Int. Cl.
*H01L 23/522* (2006.01)
*H01L 23/528* (2006.01)
*H01L 25/00* (2006.01)
*H01L 27/06* (2006.01)
*H01L 21/822* (2006.01)

(56) References Cited

U.S. PATENT DOCUMENTS

| | | | |
|---|---|---|---|
| 8,729,673 | B1 | 5/2014 | Okandan et al. |
| 8,742,476 | B1 | 6/2014 | Or-Bach et al. |
| 2001/0005059 | A1 | 6/2001 | Koyanagi et al. |
| 2002/0171080 | A1 | 11/2002 | Faris |
| 2002/0171800 | A1 | 11/2002 | Miyazaki et al. |
| 2007/0135013 | A1 | 6/2007 | Faris |
| 2007/0254455 | A1 | 11/2007 | Yamaguchi et al. |
| 2008/0291767 | A1 | 11/2008 | Barnes et al. |
| 2009/0294814 | A1 | 12/2009 | Assefa et al. |
| 2011/0171813 | A1 | 7/2011 | Rogers et al. |
| 2012/0193752 | A1 | 8/2012 | Purushothaman et al. |
| 2013/0214423 | A1 | 8/2013 | Sadaka |
| 2014/0264770 | A1 | 9/2014 | Okandan et al. |

OTHER PUBLICATIONS

Bai Y. et al., "Fabrication of GaAs-on-Insulator via Low Temperature Wafer Bonding and Sacrificial Etching of Ge by WcF2", Journal of the Electrochemical Society, 159 (2) H183-H190 (2012).
Partial International Search Report—PCT/US2015/048930—ISA/EPO—dated Dec. 3, 2015.
International Search Report and Written Opinion—PCT/US2015/048930—ISA/EPO—dated Mar. 16, 2016.
Taiwan Search Report—TW104131176—TIPO—dated Aug. 3, 2016.

MICROELECTROMECHANICAL SYSTEM (MEMS) BOND RELEASE STRUCTURE AND METHOD OF WAFER TRANSFER FOR THREE-DIMENSIONAL INTEGRATED CIRCUIT (3D IC) INTEGRATION

FIELD OF DISCLOSURE

Various embodiments described herein relate to three-dimensional integrated circuit (3D IC) devices, and more particularly, to 3D IC stacking using a microelectromechanical mechanical system (MEMS) bond release structure.

BACKGROUND

Three-dimensional circuit integration by stacking integrated circuits in multiple tiers allows circuit designers to achieve benefits of improved power, performance, area and cost (PPAC) beyond the Moore's law scaling limit. Various schemes of three-dimensional integrated circuit (3D IC) stacking, including silicon-in-package (SiP) 3D IC stacking schemes such as wire-bond, flip-chip bond, through-silicon via (TSV) and silicon interposer technologies have been developed in order to achieve higher densities in circuitry, inter-tier links and vias. 3D ICs with multi-tier stacking are desirable in devices in which form factor requirements are stringent, such as smartphones and other mobile devices. In addition to conventional SiP 3D IC stacking schemes, sequential monolithic 3D IC (sM3DIC) technology has been developed. In sM3DIC, a single crystal semiconductor layer is sequentially integrated and bonded onto a finished lower-tier complementary metal oxide semiconductor (CMOS) wafer, and an upper-tier CMOS is then built upon it.

The sM3DIC technology is currently considered to have the potential of achieving huge PPAC benefits with high inter-tier link/via densities, on the order of more than 1,000,000 links per square millimeter. However, the sM3DIC technology currently faces several significant process integration challenges that need to be overcome before it can become commercially feasible. Such challenges may include, for example, low thermal budget/process requirements for upper-tier source/drain (S/D) ohmic contact, channel/well dopant activation, S/D recrystallization, and potential contamination problems related to copper interconnect processes when the lower-tier wafer completed by a back end-of-line (BEOL) process is brought to the front end-of-line (FEOL).

Another 3D IC stacking scheme, called parallel monolithic 3D IC (pM3DIC), may be capable of achieving inter-tier link/via densities on the order of about 100,000 to 1,000,000 links per square millimeter. In pM3DIC, a wafer-to-wafer (W2W) hybrid bonding (metal-to-metal and oxide-to-oxide fusion bonding) technique is used which includes a high-precision W2W alignment process having a tolerance of less than 0.5 µm in combination with a very thin upper-tier wafer having a thickness of less than 5 µm after removal of the bulk silicon. The high-precision W2W alignment process allows the landing pad size to be reduced while the very thin upper-tier wafer allows the size of through-silicon and through-oxide inter-tier vias to be reduced, thereby achieving an increase the inter-tier link/via density.

Even though the pM3DIC approach is currently considered to be capable of offer an intermediate level of inter-tier link/via density within a shorter development period, significant process challenges may still exist. For example, while it is possible to thin the upper-tier wafer down to 5 µm or less by using existing wafer thinning techniques, such as mechanical wafer backgrinding including a coarse grinding and a fine polish followed by chemical-mechanical polish (CMP), CMOS device characteristics are found to drift when the wafer is thinned down to 25 µm or less due to particle-induced stress impact onto the CMOS device during the mechanical grinding process in the bumping line. Moreover, with existing mechanical wafer grinding and CMP technologies, it may still be difficult to achieve a reasonable total thickness variation (TTV) of 1 µm or less.

Another approach for wafer thinning for a CMOS imager utilizes selective wet etch on a P+ etch stop layer. However, such an approach may present challenges for obtaining a reasonable process window to control precise and uniform layer thickness, to control defect density, and to manage boron doping diffusion during the remaining CMOS process. Alternatively, a silicon-on-insulator (SOI) wafer may provide an acceptable solution for precise wafer thinning down to the "buried oxide" (BOX) layer, that is, a layer including a silicon (Si) layer and a silicon dioxide ($SiO_2$) layer processed by coarse and fine grinding, followed by CMP, and then followed by selective wet etch of Si and $SiO_2$. The SOI wafer may be used as the starting wafer for the upper-tier. However, once the wafer is processed by mechanical grinding through the bumping line, the wafer may often be contaminated with heavy metals such as gold, silver, tin, or other metals in practice. With heavy metal contamination, the wafer can no longer be practically processed in the BEOL to add additional backside metals with fine pitch metal layers, thus losing 3D integration flexibility in terms of interconnect configurations. Moreover, other factors such as wafer cost, material utilization, and throughput considerations, for example, may not be favorable for pM3DIC integration.

SUMMARY

Exemplary embodiments are directed to a microelectromechanical system (MEMS) bond release structure for wafer transfer and a method of making the same, and a three-dimensional integrated circuit device and a method of making the same by using the MEMS bond release structure for wafer transfer.

In an embodiment, a microelectromechanical system (MEMS) bond release structure is provided, the structure comprising: a carrier wafer; a MEMS sacrificial release layer on the carrier wafer; a semiconductor oxide layer on the MEMS sacrificial release layer; and an active semiconductor layer on the semiconductor oxide layer.

In another embodiment, a method of making a microelectromechanical system (MEMS) bond release structure is provided, the method comprising: providing a carrier wafer; providing a MEMS sacrificial release layer on the carrier wafer; providing a semiconductor oxide layer on the MEMS sacrificial release layer; and providing an active semiconductor layer on the semiconductor oxide layer.

In another embodiment, a three-dimensional integrated circuit device is provided, the device comprising: a substrate; a first tier of one or more integrated circuits comprising one or more metal layers and one or more inter-layer dielectric (ILD) layers; a second tier of one or more integrated circuits comprising one or more metal layers and one or more ILD layers; and a first BOX layer in contact with at least one of the ILD layers in the second tier of one or more integrated circuits, wherein one or more portions of the first BOX layer and one or more portions of said at least one of the ILD layers in the second tier of one or more integrated circuits are removed to form one or more vias through the first BOX layer and said at least one of the ILD layers in the second tier.

In yet another embodiment, a method of making a three-dimensional integrated circuit device is provided, the method comprising: providing a substrate; forming a first tier of one or more integrated circuits comprising one or more metal layers and one or more inter-layer dielectric (ILD) layers; forming a second tier of one or more integrated circuits comprising one or more metal layers and one or more ILD layers; forming a first BOX layer in contact with at least one of the ILD layers in the second tier of one or more integrated circuits; and forming one or more vias through the first BOX layer and said at least one of the ILD layers in the second tier.

BRIEF DESCRIPTION OF THE DRAWINGS

The accompanying drawings are presented to aid in the description of embodiments and are provided solely for illustration of the embodiments and not limitations thereof.

DETAILED DESCRIPTION

Aspects of the disclosure are described in the following description and related drawings directed to specific embodiments. Alternate embodiments may be devised without departing from the scope of the disclosure. Additionally, well known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an," and "the," are intended to include the plural forms as well, unless the context clearly indicates otherwise. It will be further understood that the terms "comprises," "comprising," "includes," or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise.

Figure 1:
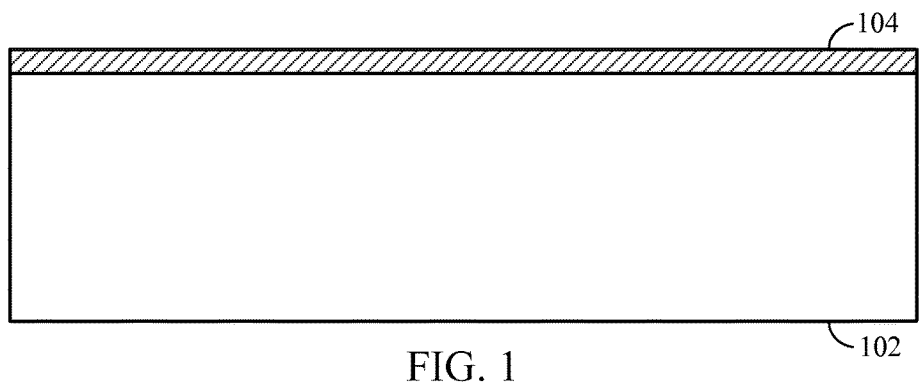
FIG. 1 is a cross-sectional view of a carrier wafer and a microelectromechanical system (MEMS) sacrificial release layer, illustrating an embodiment of a structure in the initial step of fabricating a MEMS bond release structure.

FIG. 1 is a cross-sectional view of a carrier wafer 102 and a microelectromechanical system (MEMS) sacrificial release layer 104 on top of the carrier wafer 102, illustrating an embodiment of a structure in the initial step of fabricating a MEMS bond release structure. In an embodiment, the carrier wafer 102 comprises a silicon wafer. The MEMS sacrificial release layer 104 may comprise a material such as molybdenum (Mo), germanium (Ge), germanium oxide (GeOx), silicon oxide (SiOx) including silicon dioxide ($SiO_2$), or other types of sacrificial material. In an embodiment, the MEMS sacrificial release layer 104 may be provided on the carrier wafer 102 by using a conventional deposition process, such as a chemical vapor deposition (CVD), a plasma-enhanced chemical vapor deposition (PECVD), a physical vapor deposition (PVD) process, for example.

Figure 2:
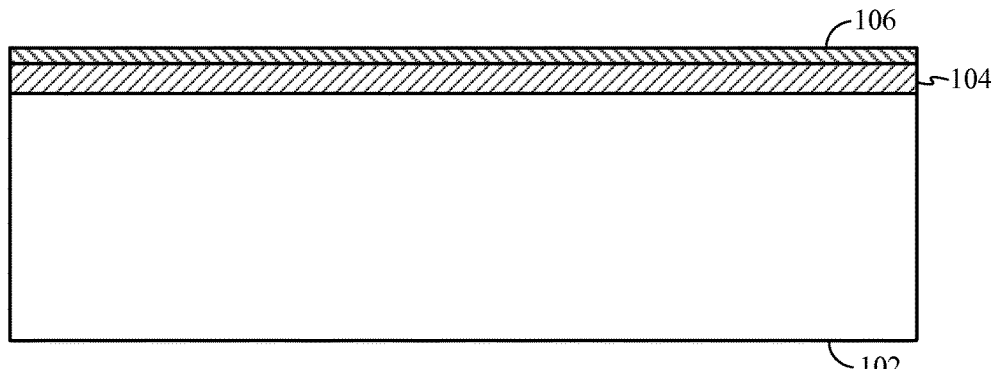
FIG. 2 is a cross-sectional view of a carrier wafer, a MEMS sacrificial release layer, and an oxide layer, illustrating an embodiment of a structure in the second step of fabricating a MEMS bond release structure.

FIG. 2 is a cross-sectional view of the carrier wafer 102, the MEMS sacrificial release layer 104 on top of the carrier wafer 102, and an oxide layer 106 for oxide-to-oxide fusion bonding on top of the MEMS sacrificial release layer 104, illustrating an embodiment of a structure in the second step of fabricating the MEMS bond release structure. In an embodiment, the oxide layer 106 comprises a thin oxide material such as silicon dioxide ($SiO_2$) for oxide-to-oxide bonding. In an embodiment, the oxide layer 106 may be provided on the MEMS sacrificial release layer 104 by using a conventional deposition process such as a CVD process, for example. In a further embodiment, the oxide layer 106 may be provided on the MEMS sacrificial release layer 104 by a plasma-enhanced chemical vapor deposition (PECVD) process, for example.

Figure 3:
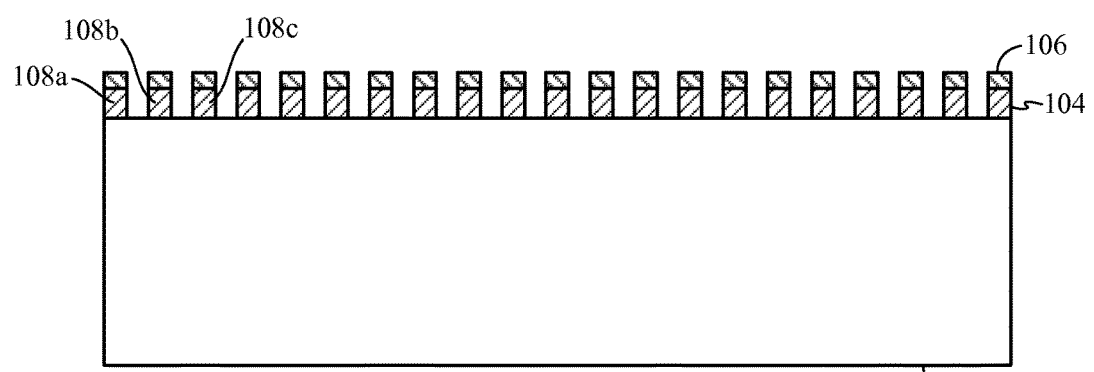
FIG. 3 is a cross-sectional view of a plurality of MEMS posts or pillars on a carrier wafer, illustrating an embodiment of a structure in the third step of fabricating a MEMS bond release structure.

FIG. 3 is a cross-sectional view of a MEMS post/pillar bond release structure having a plurality of MEMS posts or pillars 108a, 108b, 108c, . . . on the carrier wafer 102, illustrating an embodiment of a structure in the third step of fabricating the MEMS bond release structure. In an embodiment, each of the MEMS posts or pillars 108a, 108b, 108c, . . . comprises a MEMS sacrificial release layer 104 on top of the carrier wafer 102 and an oxide layer 106 on top of the MEMS sacrificial release layer 104. In an embodiment, the MEMS posts or pillars 108a, 108b, 108c, . . . as shown in FIG. 3 may be formed by patterning and etching the continuous MEMS sacrificial release layer 104 and the oxide layer 106 as shown in FIG. 2, for example.

Figure 10A:
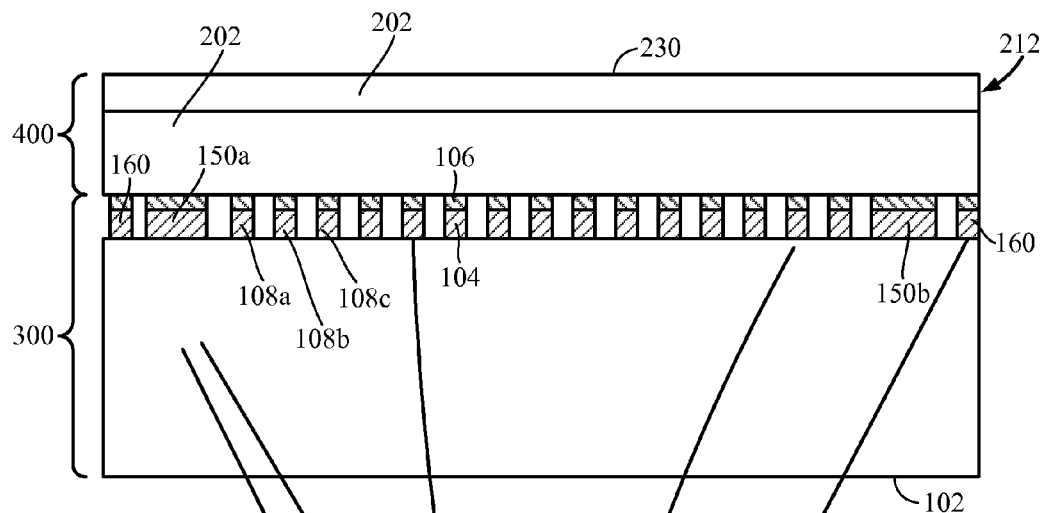
FIGS. 10A and 10B are cross-sectional and top views, respectively, of an embodiment of a MEMS post/pillar bond release structure in which outer and inner MEMS posts or pillars have different widths.
Figure 10B:
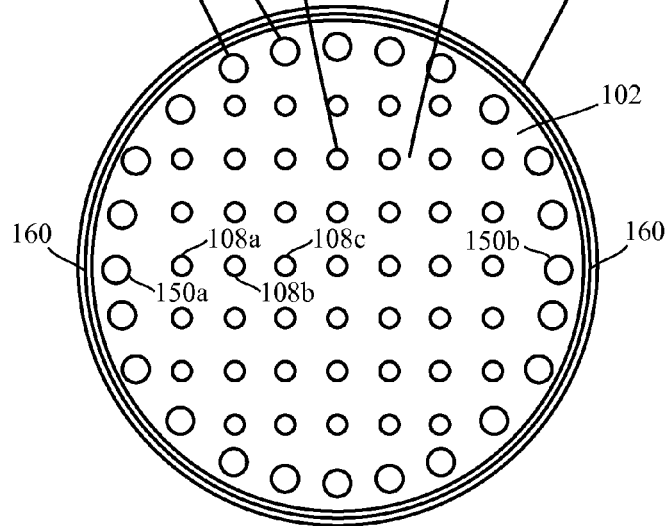
Figure 11:
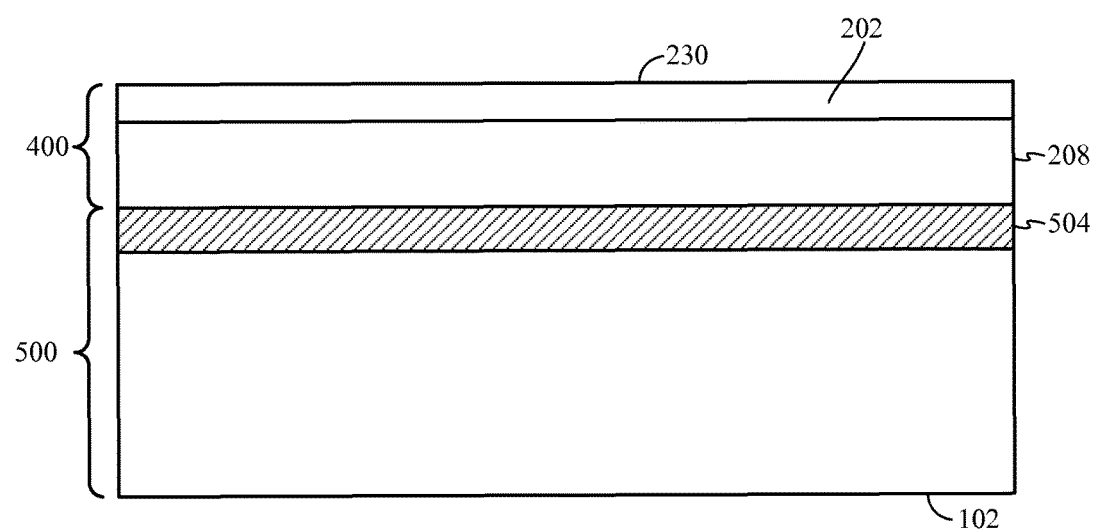
FIG. 11 is a cross-sectional view of an alternate embodiment of a MEMS bond release structure with a continuous MEMS sacrificial release layer.

Although the cross-sectional view of FIG. 3 shows a plurality of MEMS posts or pillars 108a, 108b, 108c, . . . as being substantially identical to one another with substantially equal spacing, the MEMS posts or pillars on a given carrier wafer need not have the same width, and spacings between adjacent MEMS posts or pillars need not be identical, as will be described below with reference to an embodiment as shown in FIGS. 10A and 10B. Moreover, in an alternate embodiment, MEMS posts or pillars need not be fabricated, and the MEMS sacrificial release layer 104 may be formed instead as a continuous layer, which will be described below with reference to an embodiment as shown in FIG. 11.

Figure 4A:
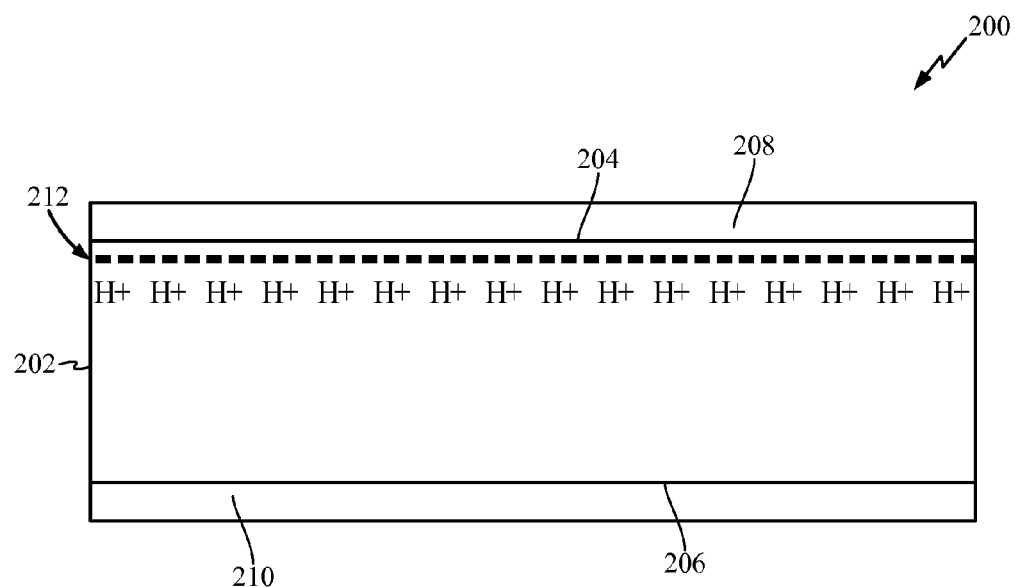
FIG. 4A is a cross-sectional view of an embodiment of a transfer substrate, which is initially provided separately from the carrier wafer as shown in FIGS. 1-3, for fabricating a MEMS bond release structure.

FIG. 4A is a cross-sectional view of an embodiment of a transfer substrate 200, which is initially provided separately from the carrier wafer 102 as shown in FIGS. 1-3. In the embodiment shown in FIG. 4A, the transfer substrate 200 comprises a bulk wafer 202 having opposite surfaces 204 and 206, and two semiconductor oxide layers 208 and 210 disposed on the surfaces 204 and 206 of the bulk wafer 202, respectively. In this embodiment, two semiconductor oxide layers 208 and 210 are thermally-oxidized and positioned to sandwich the bulk wafer 202. Alternatively, only one semiconductor oxide layer 208 is provided for illustration on the surface 204 of the bulk wafer 202. In an embodiment, the bulk wafer 202 of the transfer substrate 200 comprises a silicon wafer, whereas each of the semiconductor oxide layers 208 and 210 comprises $SiO_2$. In an embodiment, the $SiO_2$ layers 208 and 210 may be formed on the bulk silicon wafer 202 by thermally-oxidizing the surfaces of the bulk silicon wafer 202, for example.

Figure 4B:
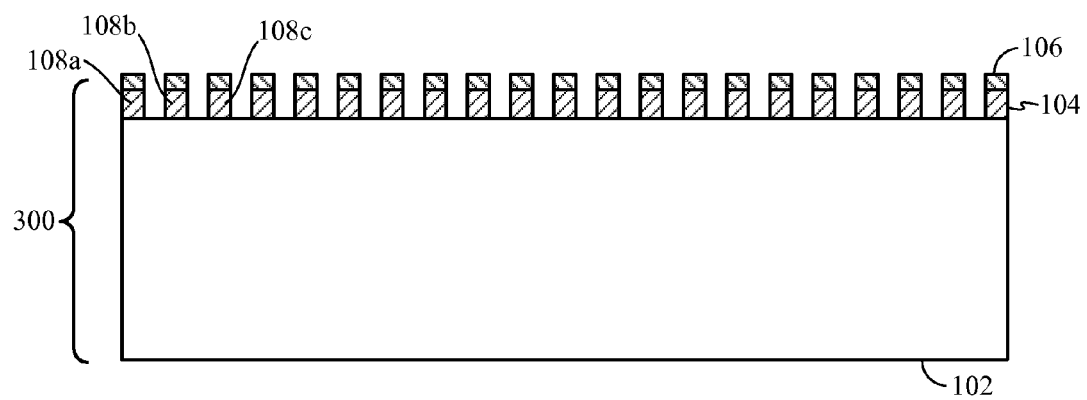
FIG. 4B is a cross-sectional view of an embodiment of a carrier substrate comprising the structure of FIG. 3 before the transfer substrate is bonded to the carrier substrate.

In an embodiment, a dopant is implanted to a portion 212 near the surface 204 of the bulk wafer 202 in contact with the semiconductor oxide layer 208. In an embodiment in which the bulk wafer 202 is sandwiched by two semiconductor oxide layers 208 and 210 as shown in FIG. 4A, dopant implantation may be applied to only a portion near one of the surfaces of the bulk wafer in contact with one of the semiconductor layers, for example, the portion 212 near the surface 204 of the bulk wafer 202 in contact with the semiconductor oxide layer 208. In an embodiment, an ion implantation process such as H+ delta implantation may be applied to the portion 212 near the surface 204 of the bulk wafer 202, for example. FIG. 4B is a cross-sectional view of a carrier substrate 300, which includes the carrier wafer 102 and the plurality of MEMS posts or pillars 108a, 108b, 108c, . . . each having a MEMS sacrificial release layer 104 and an oxide layer 106 as shown in FIG. 3, before the transfer substrate 200 of FIG. 4A is flipped over and bonded to the carrier substrate 300 of FIG. 4B.

Figure 5A:
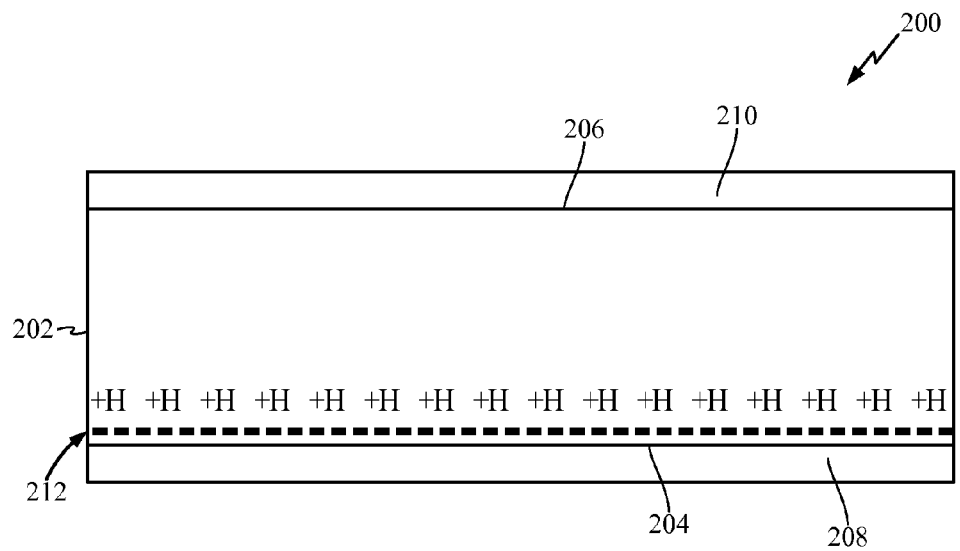
FIG. 5A is a cross-sectional view of the embodiment of the transfer substrate of FIG. 4A flipped upside down before it is bonded to the carrier substrate.
Figure 5B:
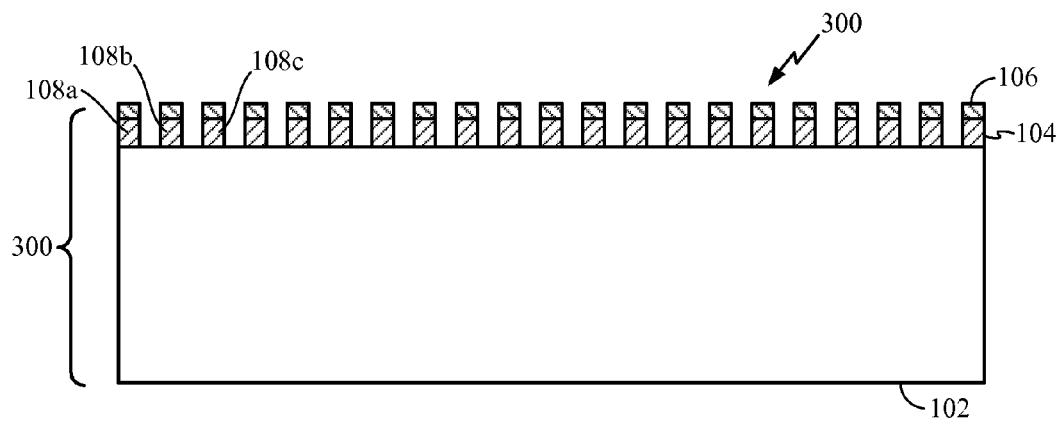
FIG. 5B is a cross-sectional view of the carrier substrate of FIG. 4B ready for accepting bonding of the flipped-over transfer substrate of FIG. 5A.

In practice, it is usually easier to implant a dopant from the top surface 204 rather than the bottom surface 206 of the bulk wafer 202 of the transfer substrate 200, the initial orientation of which is shown in FIG. 4A, consistent with the initial orientation of the MEMS post/pillar bond release structure as shown in FIG. 4B. In an embodiment, the transfer substrate 200 is flipped upside down, as shown in the cross-sectional view of FIG. 5A, before it is bonded to the carrier substrate 300, the cross-sectional view of which is shown in FIG. 5B.

Figure 6:
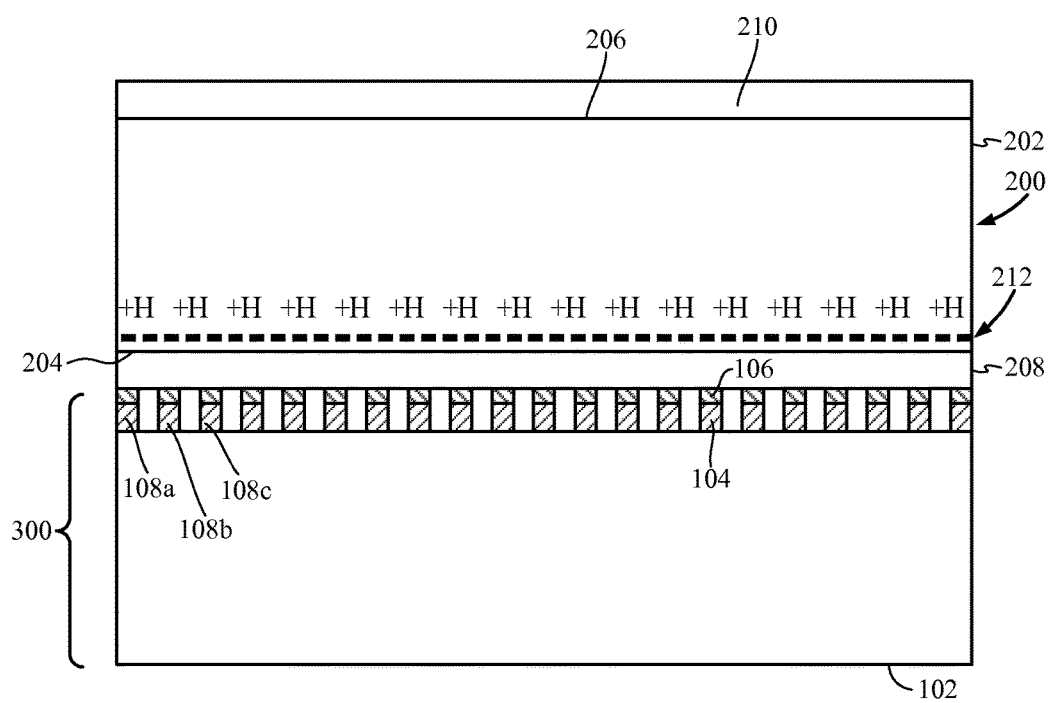
FIG. 6 is a cross-sectional view of an embodiment of a bonded structure after the flipped-over transfer substrate is bonded to the carrier substrate.

FIG. 6 is a cross-sectional view of an embodiment of a bonded structure which is a combination of the carrier substrate 300 and the transfer substrate 200 after the flipped-over transfer substrate 200 is bonded to the carrier substrate 300. In the embodiment shown in FIG. 6, the semiconductor oxide layer 208, which is in contact with the surface 204 of the bulk wafer 202 to which H+ delta implantation was applied, is directly bonded to the oxide layer 106 of each of the MEMS posts or pillars 108a, 108b, 108c, . . . .

Figure 7:
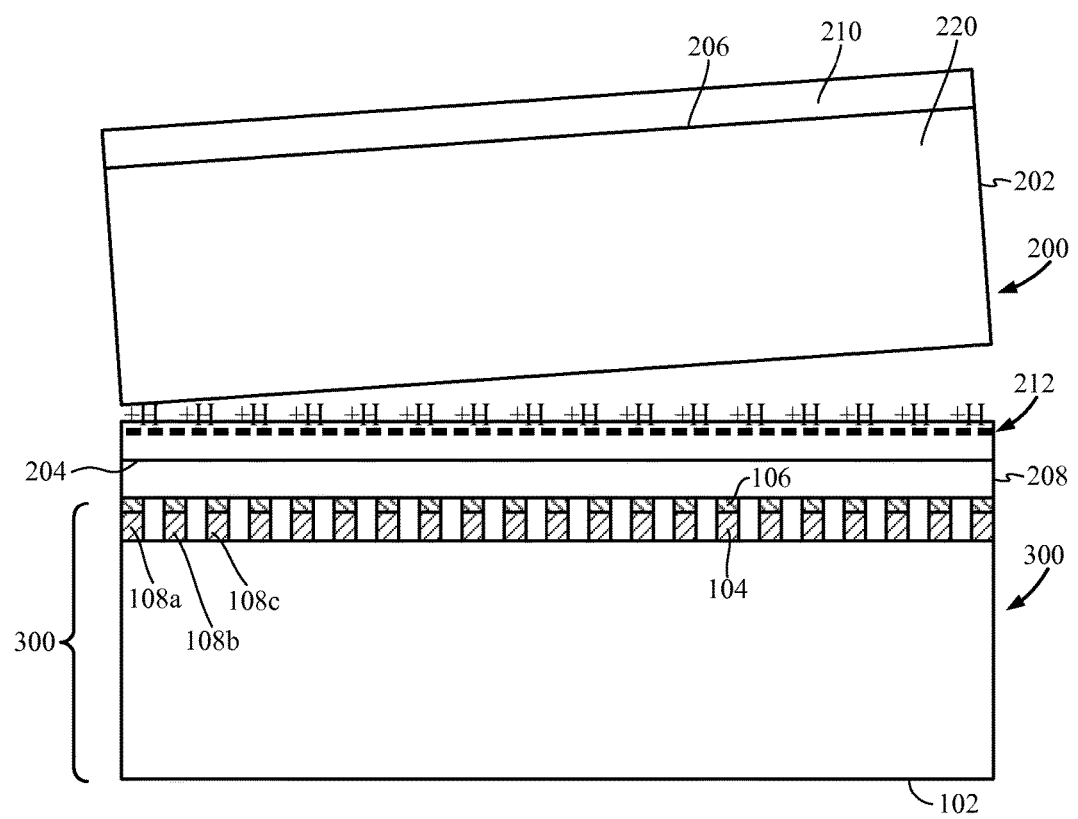
FIG. 7 is a cross-sectional view of an embodiment showing separation of a portion of the transfer substrate from the carrier substrate while leaving another portion of the transfer substrate intact with the carrier substrate.

FIG. 7 is a cross-sectional view of an embodiment showing separation of a portion of the transfer substrate 200 from the carrier substrate 300, while leaving the H+ delta implanted portion 212 of the bulk wafer 202 and the semiconductor oxide layer 208 on the surface 204 of the H+ delta implanted portion 212 of the bulk wafer 202 intact with the carrier substrate 300. In an embodiment, an undoped portion 220 of the bulk wafer 202 and the semiconductor oxide layer 210 on the surface 206 opposite the H+ delta implanted portion 212 of the bulk wafer 202 are separated from the H+ delta implanted portion 212 of the bulk wafer 212. Separation of the undoped portion 220 of the bulk wafer 202 from the H+ delta implanted portion 212 of the bulk wafer 202 may be achieved by cleavage, for example.

Figure 8:
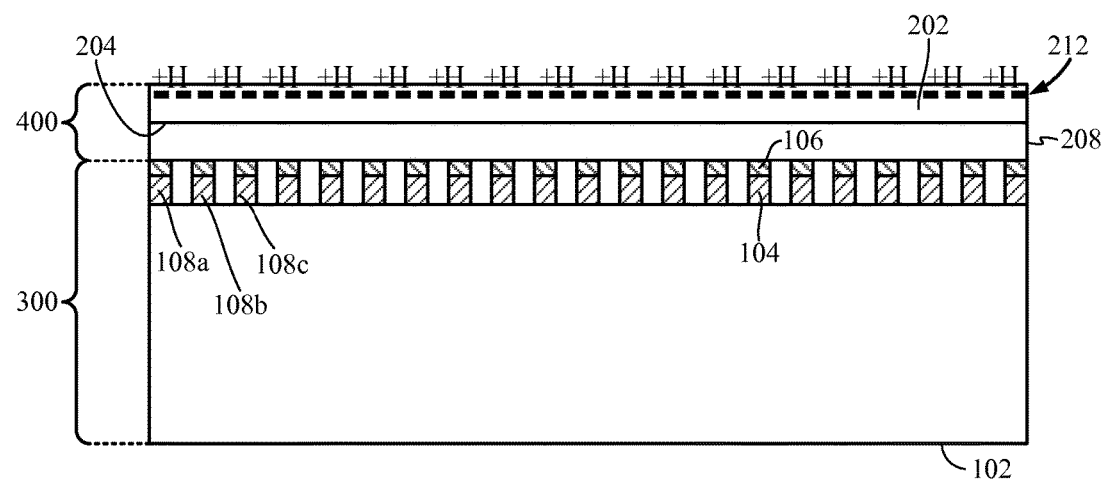
FIG. 8 is a cross-sectional view of a MEMS pillar/post bond release structure after separation of a portion of the transfer substrate.

FIG. 8 is a cross-sectional view of a MEMS pillar/post bond release structure after the undoped portion of the bulk wafer of the transfer substrate is separated or cleaved from the H+ delta implanted portion 212 of the bulk wafer 202. As shown in FIG. 8, the H+ delta implanted portion 212 of the bulk wafer 202 and the semiconductor oxide layer 208 on the surface 204 of the H+ delta implanted portion 212 of the bulk wafer 202 are now integrated parts of the MEMS post/pillar bond release structure, which also includes the carrier wafer 102 and the plurality of MEMS posts or pillars 108a, 108b, 108c, . . . each having a MEMS sacrificial release layer 104 and a thin oxide layer 106.

In an embodiment, the semiconductor oxide layer 208, which may comprise an $SiO_2$ layer, is directly positioned on the thin oxide layer 106 of each of the MEMS posts or pillars 108a, 108b, 108c, . . . . In an embodiment in which the bulk wafer 202 of the transfer substrate 200 comprises silicon and the semiconductor oxide layer 208 of the transfer substrate 200 comprises $SiO_2$, the H+ delta implanted portion 212 of the bulk wafer 202 and the semiconductor oxide layer 208 together form a silicon-on-insulator (SOI) substrate 400. Such a SOI substrate 400 may also be regarded as a $SiO_2$ BOX layer in the fabrication of 3D ICs, which will be described below with reference to FIGS. 13-21.

Figure 9:
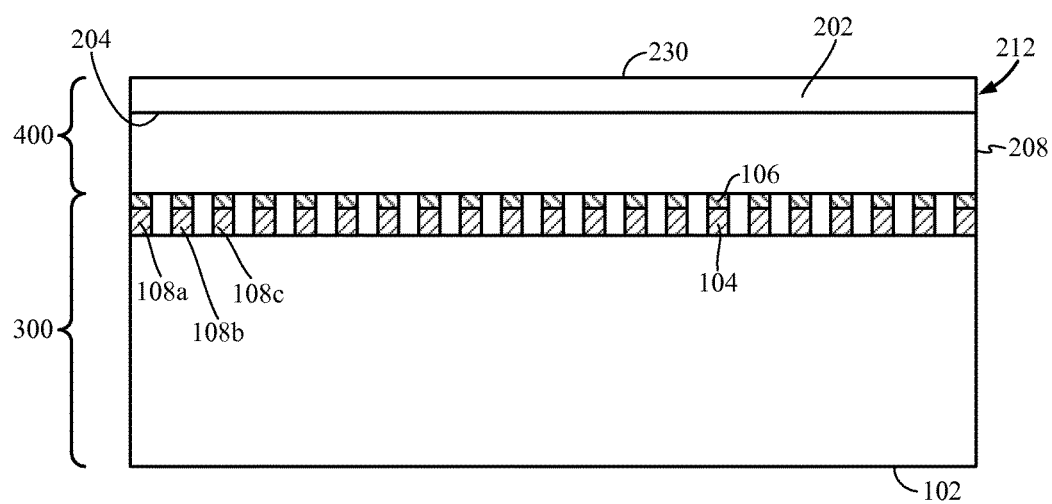
FIG. 9 is a cross-sectional view of an embodiment of a finished MEMS pillar/post bond release structure.

FIG. 9 is a cross-sectional view of an embodiment of a finished MEMS pillar/post bond release structure, after the SOI substrate 400 is subjected to wafer surface finishing processes. In an embodiment, the finishing processes may include, for example, a post-bonding chemical mechanical polish (CMP) process to smooth the top surface 230 of the H+ delta implanted portion 212 bulk wafer 202 resulting from the separation or cleavage of the undoped portion of the bulk wafer from the MEMS pillar/post bond release structure as described above with reference to FIG. 7. In a further embodiment, the finishing processes may also include ozone oxidation treatment for the SOI substrate 400, for example.

FIGS. 10A and 10B are side/cross-sectional and top views, respectively, of an embodiment of a MEMS post/pillar bond release structure across a semiconductor wafer, in which some of the MEMS posts or pillars may have different widths. In FIGS. 10A and 10B, a plurality of inner MEMS posts or pillars 108a, 108b, 108c, . . . are provided as part of the MEMS post/pillar bond release structure similar to the structure described above with reference to FIG. 9. In addition to the inner MEMS posts or pillars 108a, 108b, 108c, . . . , FIGS. 10A and 10B also shows a plurality of outer MEMS posts or pillars 150a, 150b, . . . surrounding the inner MEMS posts or pillars 108a, 108b, 108c, . . . . In an embodiment, each of the outer MEMS posts or pillars 150a, 150b, . . . has a width greater than the width of each of the inner MEMS posts or pillars 108a, 108b, 108c, . . . on the carrier wafer 102 to provide sufficient structural support of the entire bonded-wafers during the sacrificial layer release process. Other than having different widths, the outer MEMS posts or pillars 150a, 150b, . . . have the same two-layer structure as that of the inner MEMS posts or pillars 108a, 108b, 108c, . . . , including a MEMS sacrificial release layer 104 and a thin oxide layer 106. In a further embodiment, a sealing ring 160 is also provided along the outer perimeter of the carrier wafer 102. In an embodiment, the sealing ring 160 also has the same two-layer structure as that of the inner and outer MEMS posts or pillars, including a MEMS sacrificial release layer 104 and a thin oxide layer 106.

FIG. 11 is a cross-sectional view of an alternate embodiment of a MEMS bond release structure. Instead of the MEMS posts or pillars described above, the MEMS bond release structure in the embodiment shown in FIG. 11 includes a continuous MEMS sacrificial release layer 504 on the carrier wafer 102 to form a carrier substrate 500. In an embodiment, the SOI substrate 400, which comprises a semiconductor oxide layer 208 and a layer of bulk wafer 202, which may be doped by an H+ delta implantation process, for example, is bonded to the carrier substrate 500. In an embodiment, the carrier wafer 102 comprises silicon whereas the bulk wafer 202 comprises H+ delta doped silicon, for example. In an embodiment, the MEMS sacrificial release layer 504, which is continuously disposed across the carrier wafer 102, may comprise a sacrificial material such as Mo, Ge, $GeO_x$ or $SiO_x$ including $SiO_2$, for example. In an embodiment, the semiconductor oxide layer 208 of the SOI substrate 400 comprises $SiO_2$.

Figure 12:
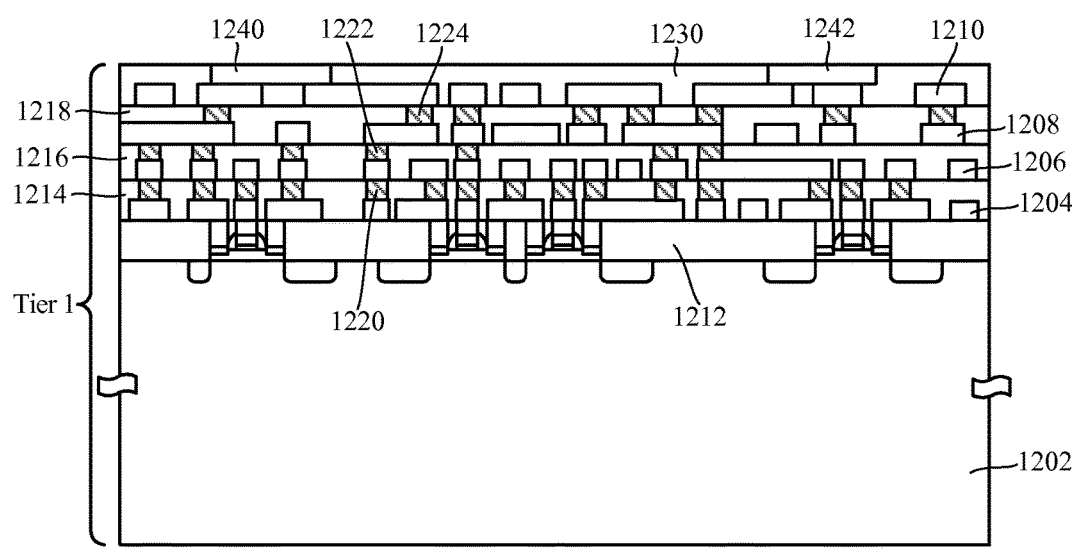
FIG. 12 is a cross-sectional view of a first tier (Tier 1) of integrated circuits prepared before one or more additional tiers of integrated circuits are stacked on Tier 1.

FIGS. 12-21 are cross-sectional views illustrating embodiments of processes for making a 3D IC by stacking multiple tiers of integrated circuits using one or more MEMS bond release structures, embodiments of which are described above with respect to FIGS. 1-11. FIG. 12 is a cross-sectional view of a first tier (Tier 1) of integrated circuits. A wafer 1202 for Tier 1, which may comprise a silicon bulk handler or a silicon-on-insulator (SOI) substrate, may be prepared in a conventional manner. In the embodiment shown in FIG. 12, the integrated circuits in Tier 1 may include one or more metal layers (M1, M2, M3, M4 layers) 1204, 1206, 1208 and 1210, and one or more inter-layer dielectric (ILD) layers (ILD-0, ILD-1, ILD-2, ILD-3 layers) 1212, 1214, 1216 and 1218.

A plurality of vias may also be provided for electrical interconnects between some or all of the metal layers through one or more of the ILD layers, including, for example, vias (V1, V2, V3) 1220, 1222 and 1224 as shown in FIG. 12. In an embodiment, an additional ILD layer (ILD-4 layer) 1230 is provided on the top metal layer (M4 layer) 1210 for oxide bonding with a second tier (Tier 2) of integrated circuits, which will be described below with reference to FIG. 13. Referring to FIG. 12, a plurality of bonding pads such as bonding pads 1240 and 1242 are provided on top of at least some of the metal contacts in the top metal layer (M4 layer) 1210 in the top ILD layer 1230 for bonding with corresponding bonding pads in the second tier of integrated circuits.

Figure 13:
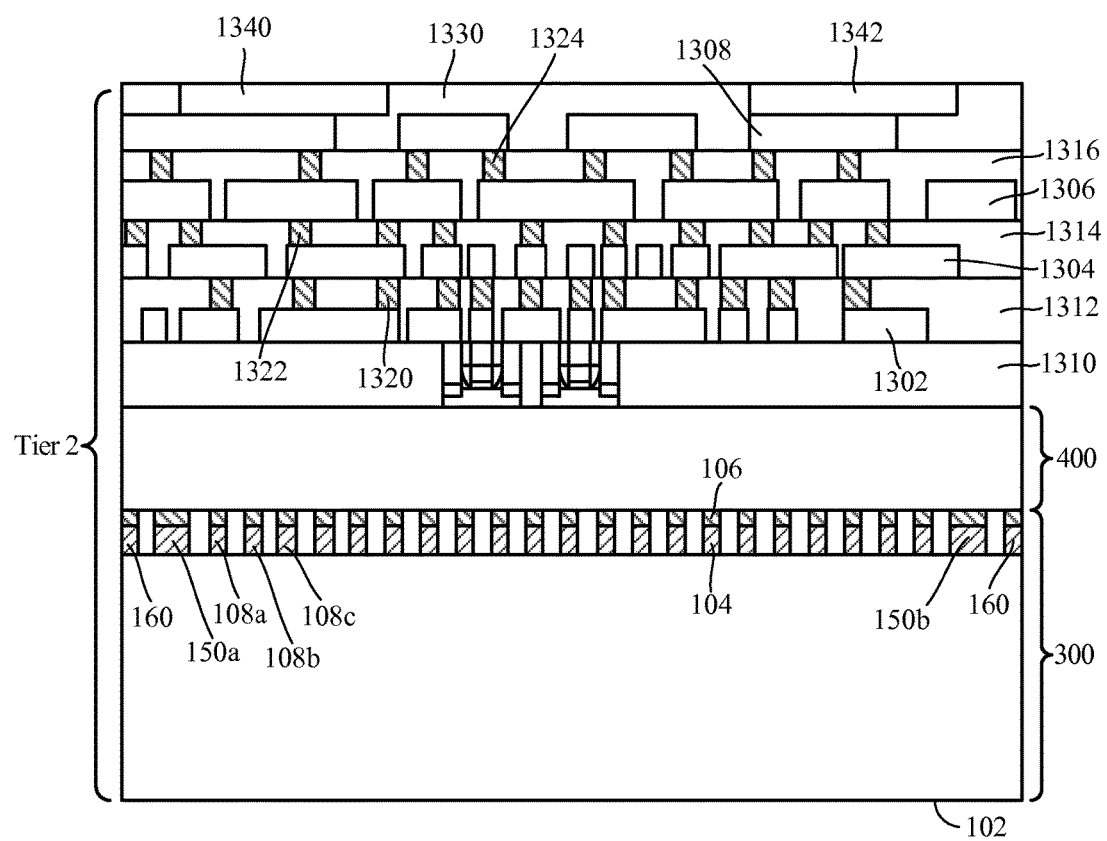
FIG. 13 is a cross-sectional view of a second tier (Tier 2) of integrated circuits prepared on a MEMS bond release structure, embodiments of which are described above with references to FIGS. 1-11, before Tier 2 is stacked on Tier 1 of integrated circuits as shown in FIG. 12.

FIG. 13 is a cross-sectional view of a second tier (Tier 2) of integrated circuits prepared on a MEMS bond release structure, embodiments of which are described above with references to FIGS. 1-11. In FIG. 13, a MEMs post/pillar bond release structure as shown in FIG. 10A is provided, which comprises a carrier wafer 102, a plurality of inner MEMS posts or pillars 108a, 108b, 108c, . . . , a plurality of outer MEMS posts or pillars 150a, 150b, . . . and a sealing ring 160 each having a MEMS sacrificial release layer 104 and a thin oxide layer 106, and a SOI substrate 400, also called a BOX layer, which may comprise a silicon dioxide ($SiO_2$) layer and an active silicon layer. Referring to FIG. 13, a plurality of metal layers (M1, M2, M3, M4 layers) 1302, 1304, 1306 and 1308 and a plurality of ILD layers (ILD-0, ILD-1, ILD-2, ILD-3 layers) 1310, 1312, 1314 and 1316 are provided on top of the SOI substrate or BOX layer 400.

Similar to Tier 1, Tier 2 of integrated circuits may also include a plurality of vias (V1, V2, V3) 1320, 1322 and 1324 provided for electrical interconnects between some or all of the metal layers through one or more of the ILD layers. Again, similar to Tier 1, Tier 2 of integrated circuits may also include a top ILD layer (ILD-4 layer) 1330 on the top metal layer (M4 layer) 1308 for oxide bonding. Furthermore, a plurality of bonding pads such as bonding pads 1340 and 1342 are provided on top of at least some of the metal contacts in the top metal layer (M4 layer) 1308 in the top ILD layer 1330 for bonding with corresponding bonding pads in the first tier (Tier 1) of integrated circuits.

Figure 14:
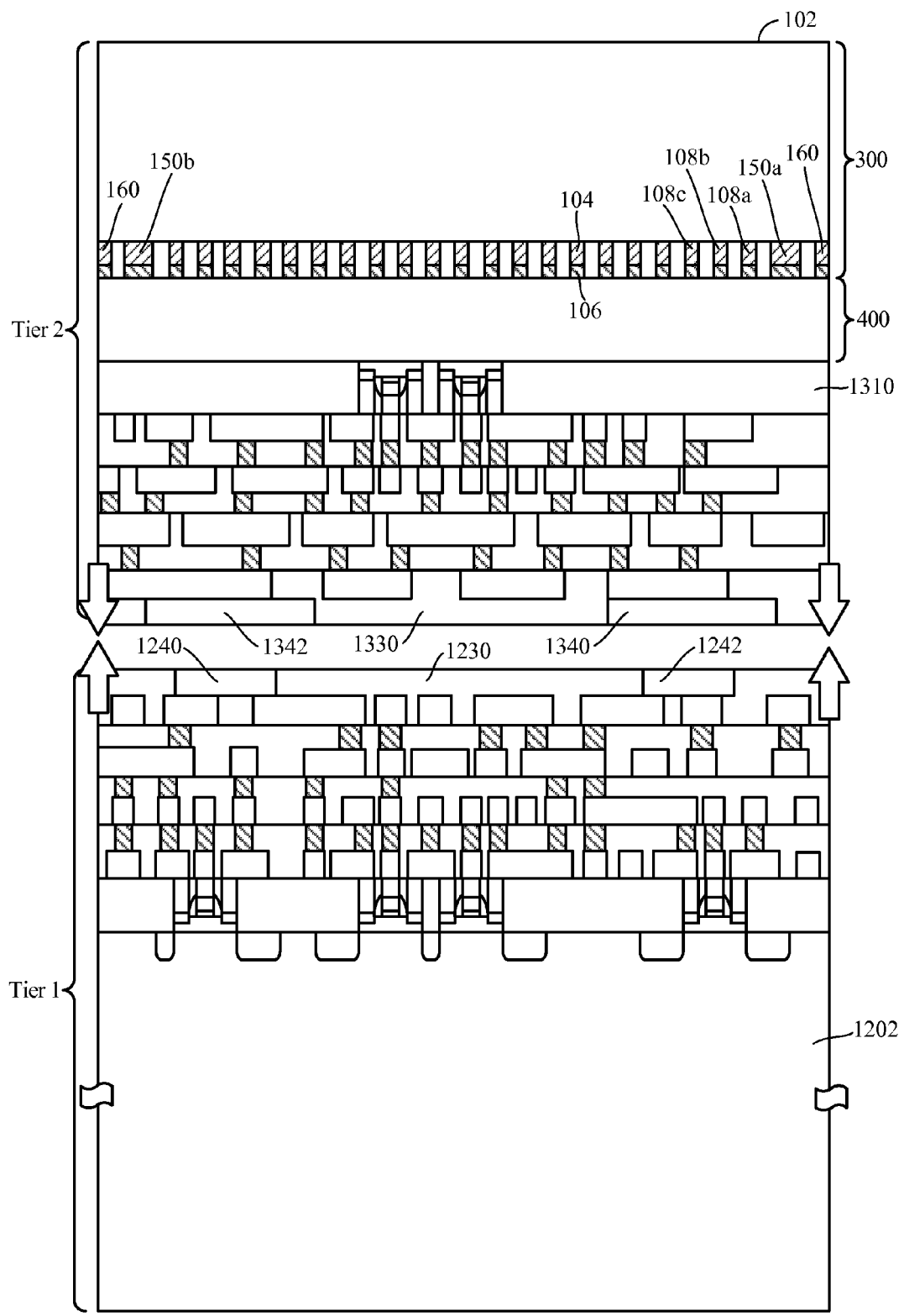
FIG. 14 is a cross-sectional view illustrating the alignment of Tier 1 and Tier 2 of integrated circuits as shown in FIGS. 12 and 13 before they are bonded together.

FIG. 14 is a cross-sectional view illustrating the alignment of Tier 1 and Tier 2 of integrated circuits before they are bonded together. In FIG. 14, Tier 2 of integrated circuits is flipped upside down from the orientation in the cross-sectional view of FIG. 13. In FIG. 14, after Tier 2 of integrated circuits attached to the BOX layer 400 of the MEMS post/pillar bond release structure is flipped upside down, the bonding pads 1342 and 1340 of Tier 2 are aligned with the bonding pads 1240 and 1242 of Tier 1, respectively. As shown in FIG. 14, the width of each bonding pad of a given tier need not be the identical to the width of the corresponding bonding pad of the other tier, as long as the corresponding pads are aligned with one another such that sufficiently good electrical connections, i.e., sufficient contact areas are established once the pads are bonded to one another.

Figure 15:
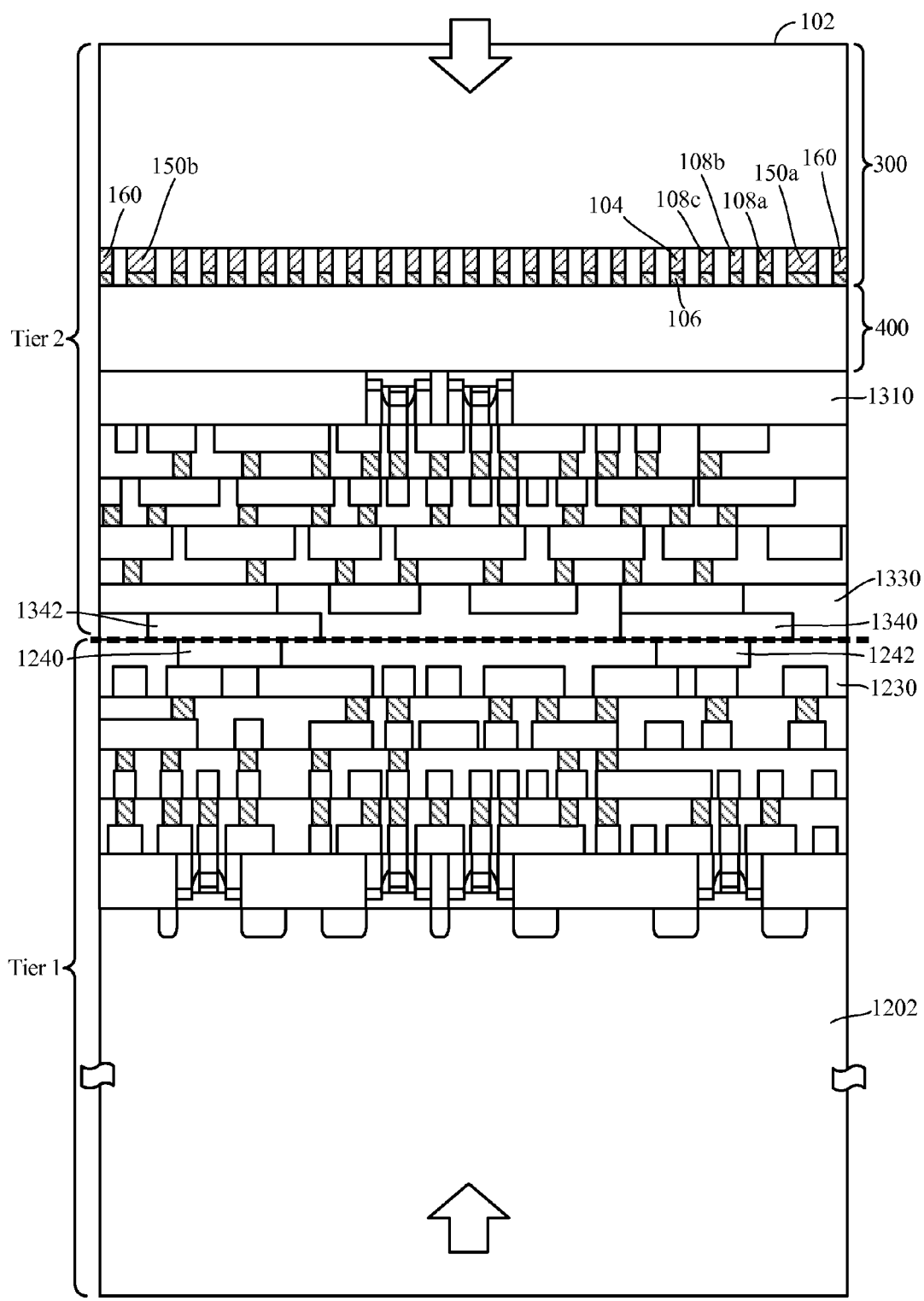
FIG. 15 is a cross-sectional view illustrating wafer-to-wafer (W2W) bonding of Tier 1 and Tier 2 of integrated circuits as shown in FIG. 14.

FIG. 15 is a cross-sectional view illustrating the wafer-to-wafer (W2W) bonding of Tier 2 and Tier 1 of integrated circuits. In FIG. 15, upon bonding of Tier 2 to Tier 1, the bonding pads 1342 and 1340 of Tier 2 are in direct contact with the bonding pads 1240 and 1242 of Tier 1, respectively, thereby establishing electrical connections between the corresponding bonding pads. Moreover, the top ILD layer (ILD-4 layer) 1230 of Tier 1 is also in direct contact with the top ILD layer (ILD-4 layer) 1330 of Tier 2, thereby forming a two-tier 3D IC.

Figure 16:
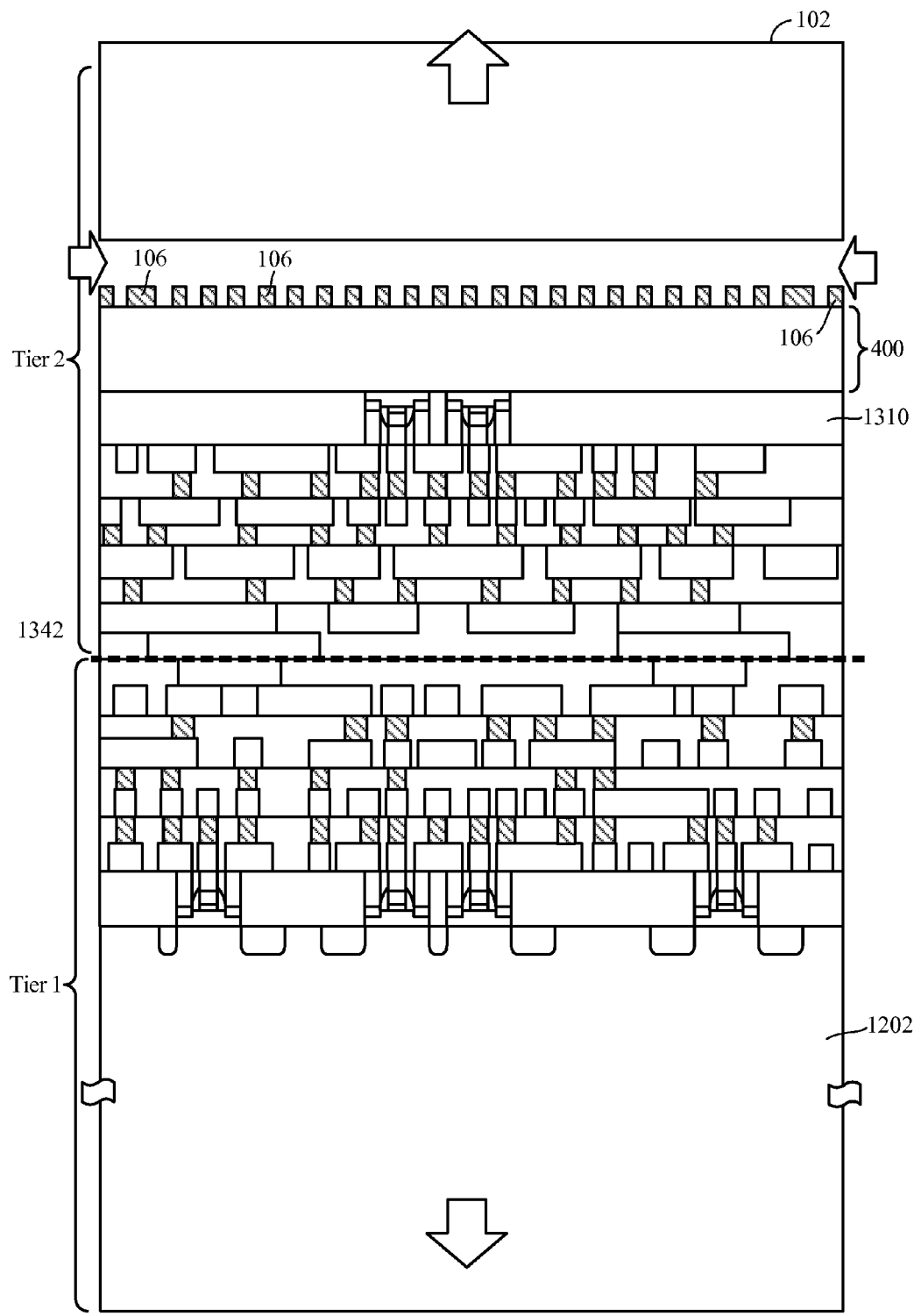
FIG. 16 is a cross-sectional view illustrating an embodiment of a two-tier 3D IC after the MEMS sacrificial release layer of the MEMS bond release structure is removed.

FIG. 16 is a cross-sectional view illustrating an embodiment of the two-tier 3D IC after the MEMS sacrificial release layer 104 in each of the inner MEMS posts or pillars 108a, 108b, 108c, . . . , the outer MEMS posts or pillars 150a, 150b, . . . and the sealing ring 160 is removed, thus leaving the thin oxide layer 106 in each of the inner and outer MEMS posts or pillars and the sealing ring intact with the BOX layer 400. In an embodiment in which the MEMS bond release structure includes a plurality of MEMS posts or pillars as shown in FIG. 2 and described above, the thin oxide layer 106 after removal of the MEMS sacrificial release layer 104 would be in the form of small protrusions on the BOX layer 400 as shown in FIG. 16. The MEMS sacrificial release layer 104 may be removed easily by release-etching process, either in wet or dry etch chemistry. For example, $XeF_2$ is widely used as a dry-etch release chemistry for Mo or Si sacrificial layer. With the removal of the MEMS sacrificial release layer, the carrier wafer 102 is completely released or detached from Tier 2 of integrated circuits.

Figure 17:
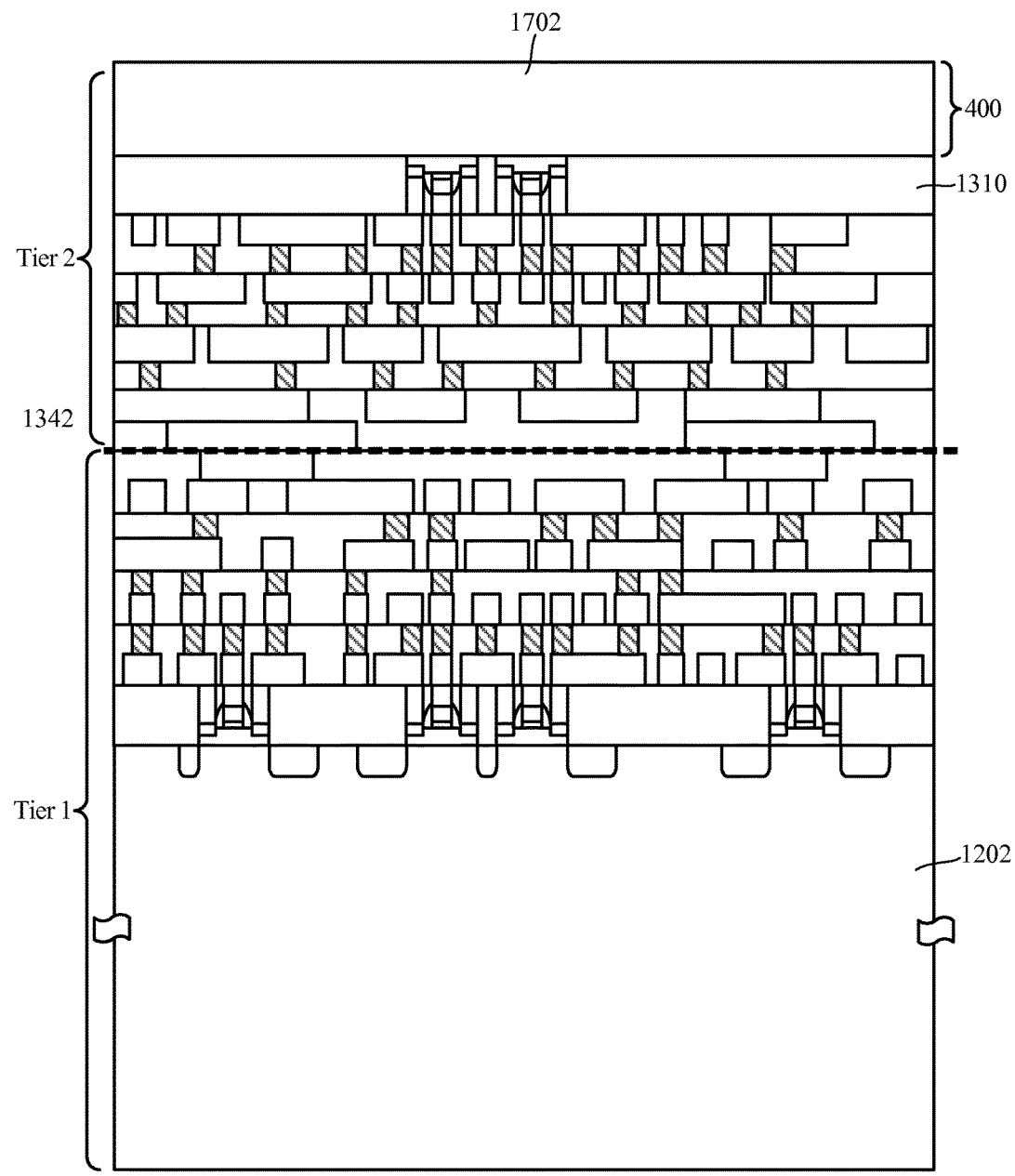
FIG. 17 is a cross-sectional view of the 3D IC of FIG. 16 after removing the remaining thin oxide layer on the BOX layer to form a smooth top surface.
Figure 18:
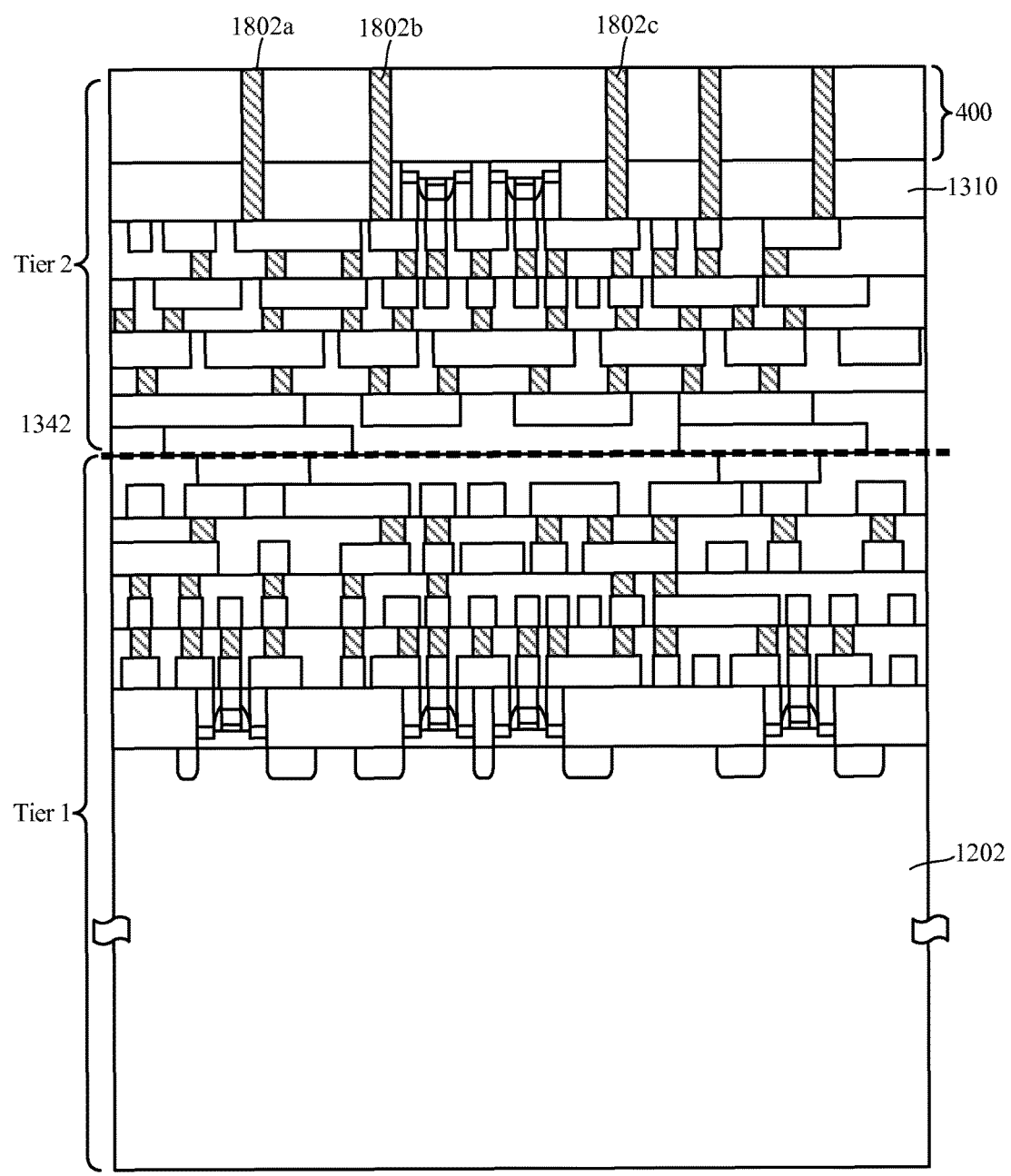
FIG. 18 is a cross-sectional view of the 3D IC of FIG. 17 after vias are formed in the BOX layer and the inter-layer dielectric (ILD) layer directly beneath the BOX layer in Tier 2.

FIG. 17 is a cross-sectional view of the 3D IC of FIG. 16 after removing the remaining thin oxide layer 106 on the BOX layer 400 to form a smooth top surface 1702 of the BOX layer 400. The top surface 1702 of the BOX layer 400 may be smoothed by a conventional polishing process, such as a chemical mechanical polish (CMP) process in back end-of-line (BEOL) in an embodiment. FIG. 18 is a cross-sectional view of the 3D IC of FIG. 17 after a plurality of vias 1802a, 1802b, 1802c, . . . are provided through the BOX layer 400 and the ILD layer (ILD-0 layer) 1310 of Tier 2 directly beneath the BOX layer 400. The vias 1802a, 1802b, 1802c may be formed by removing designated portions of the BOX layer 400 and corresponding portions of the ILD layer (ILD-0 layer) 1310 directly beneath the BOX layer 400 in a conventional manner. After the via formation, these vias are filled with metal (e.g., Cu), then followed by the CMP process typically used in the BEOL.

Figure 19:
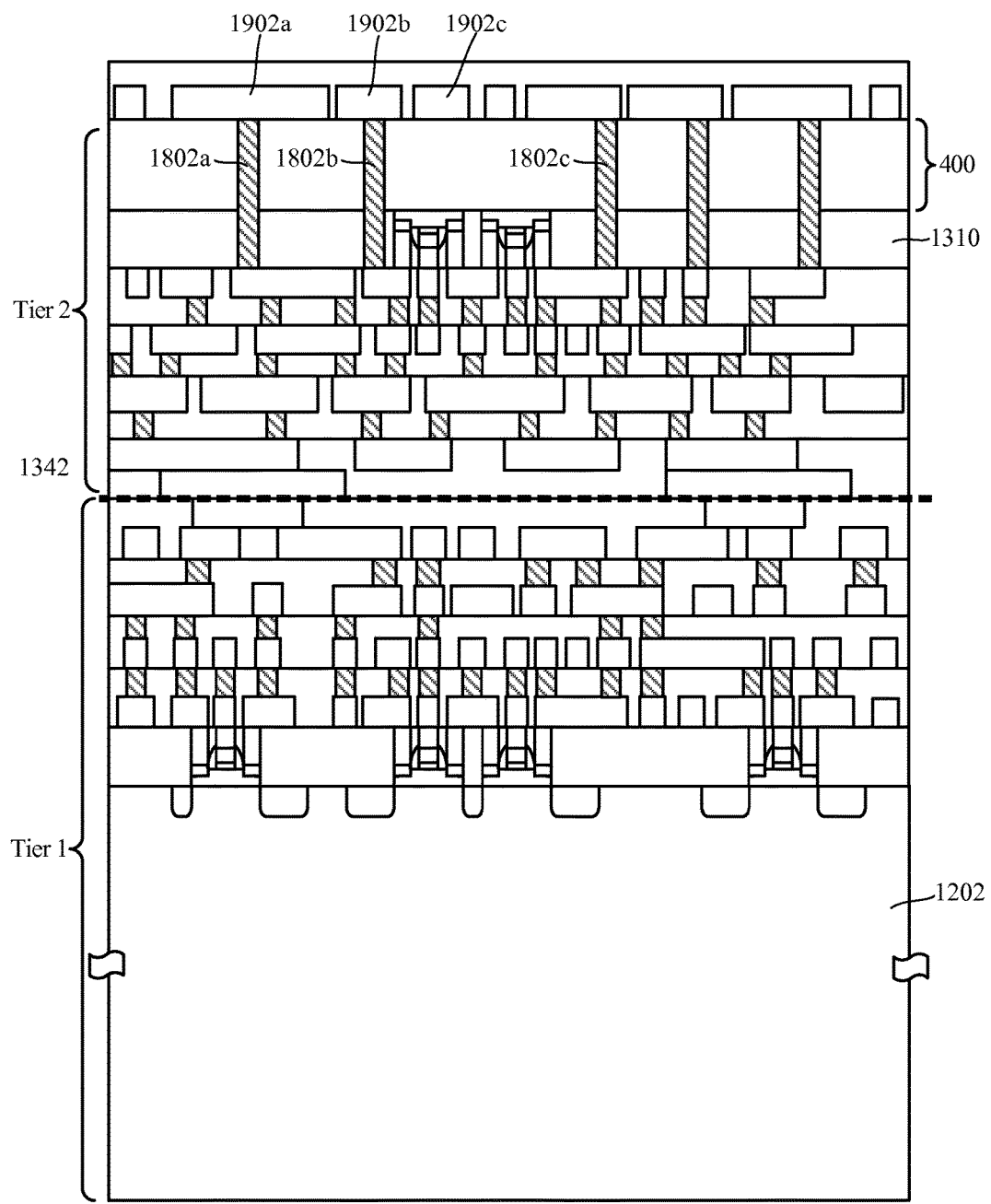
FIG. 19 is a cross-sectional view of the 3D IC of FIG. 18 after metal interconnects are formed as part of an additional metal layer over the vias in Tier 2.
Figure 20:
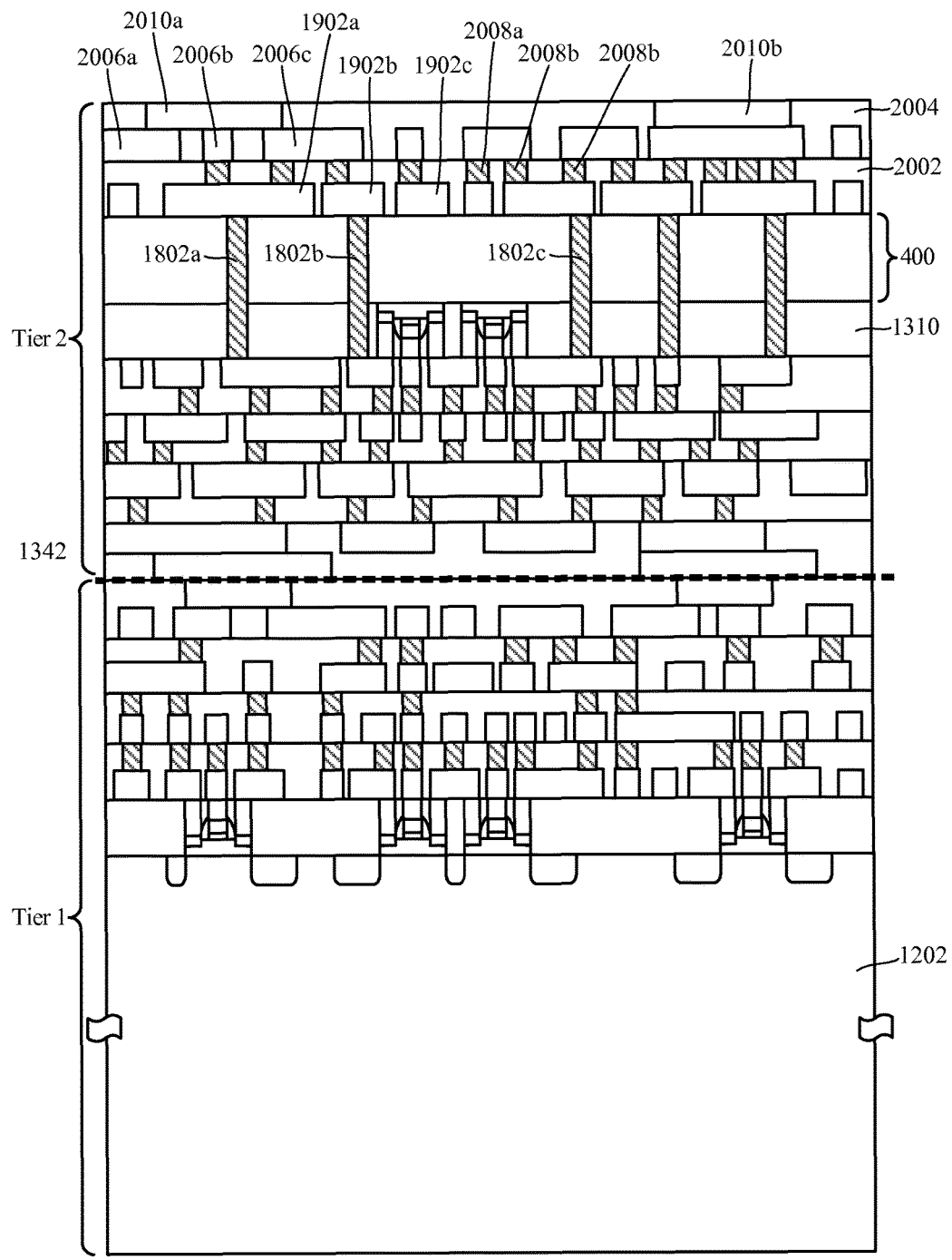
FIG. 20 is a cross-sectional view of the 3D IC of FIG. 19 after additional ILD layers are formed on the additional metal layer over the vias.

FIG. 19 is a cross-sectional view of the 3D IC of FIG. 18 after one or more metal interconnects 1902a, 1902b, 1902c, . . . are formed as part of an additional metal layer (M5 layer) over the vias 1802a, 1802b, 1802c, . . . . FIG. 20 is a cross-sectional view of the 3D IC of FIG. 19 after one or more additional ILD layers (ILD-5, ILD-6 layers) 2002 and 2004 are formed on the M5 layer in an embodiment. In a further embodiment, another additional metal layer (M6 layer) having metal interconnects 2006a, 2006b, 2006c, . . . are provided on top of the ILD-5 layer 2002 and within the ILD-6 layer 2004. In yet a further embodiment, a plurality of vias 2008a, 2008b, 2008c, . . . are provided in the ILD-5 layer 2002 to allow for electrical connections between metal interconnects of M5 and M6 layers. In an embodiment, one or more bonding pads such as bonding pads 2010a and 2010b are formed on top of one or more metal interconnects of the M6 layer.

Figure 21:
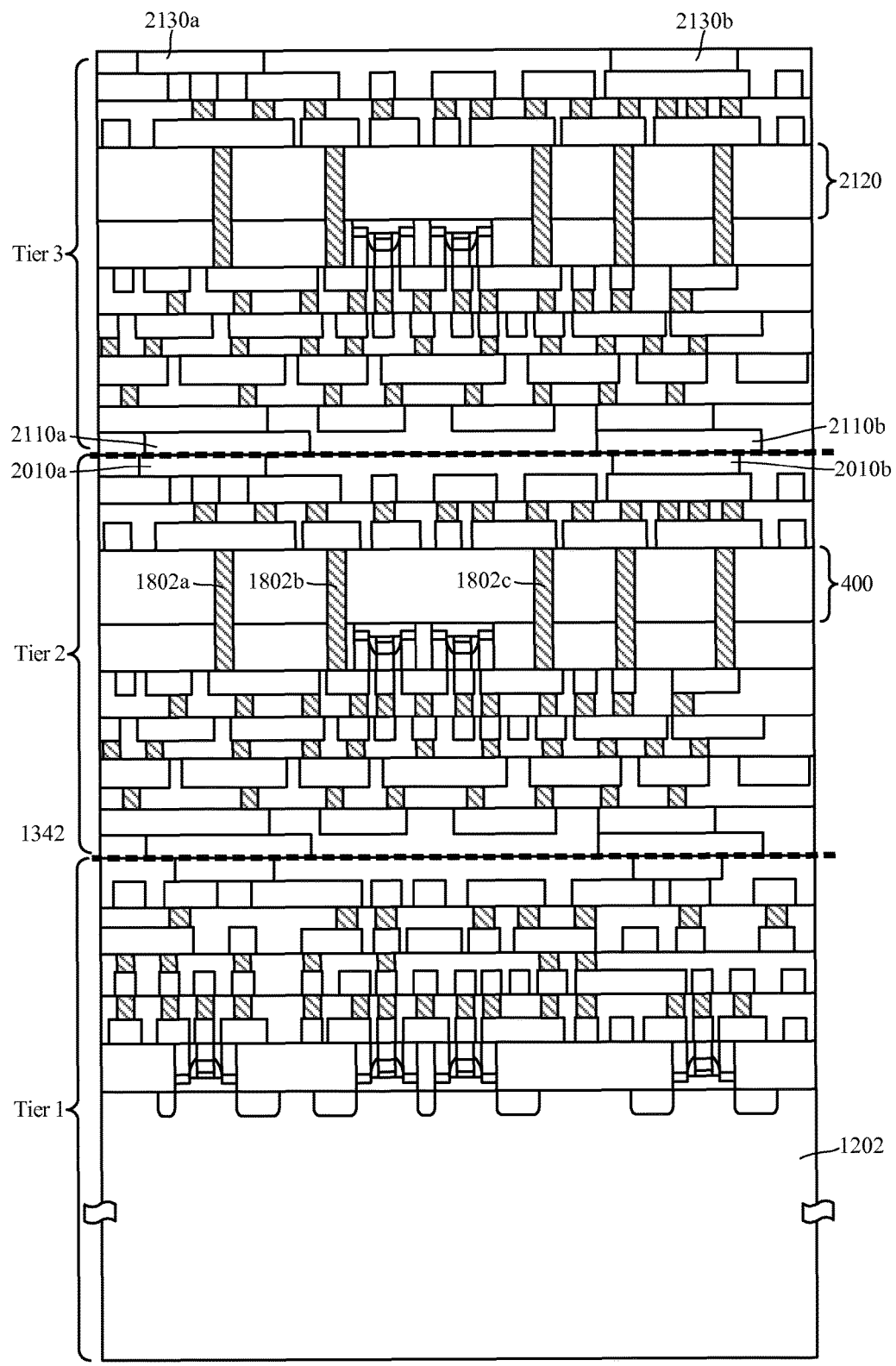
FIG. 21 is a cross-sectional view of an embodiment of a three-tier 3D IC, in which Tier 2 and Tier 1 of integrated circuits are formed and combined together by using the MEMS bond release structure.

FIG. 21 is a cross-sectional view of an embodiment of a three-tier 3D IC, in which Tier 2 and Tier 1 of integrated circuits are formed and combined together by the bonding processes described above with references to FIGS. 12-20. In the embodiment shown in FIG. 21, an additional tier, Tier 3, of integrated circuits is formed on top of Tier 2 in the same manner as the formation and bonding of Tier 2 to Tier 1 described above. In FIG. 21, bonding pads 2110a and 2110b are provided in Tier 3 and aligned with bonding pads 2010a and 2010b of Tier 2, respectively, in a wafer-to-wafer (W2W) hybrid-bonding process, for example.

In FIG. 21, an additional BOX layer 2120, which is formed by a silicon dioxide ($SiO_2$) layer and an active silicon layer in an embodiment of a MEMS bond release structure described above, is provided for Tier 3. Furthermore, one or more metal layers (M5, M6 layers) and one or more ILD layers (ILD-5, ILD-6 layers) may be provided on top of the BOX layer 2120, and one or more bonding pads 2130a and 2130b may be provided on top of the M6 layer in an embodiment to allow an additional tier of integrated circuits (not shown) to be bonded to Tier 3 in a W2W hybrid-bonding process. Multiple tiers of integrated circuits may be stacked in a similar manner to produce a multi-tier 3D IC.

Although some of the embodiments described above relate to the processing of silicon integrated circuits, the principles of the disclosure are also applicable to integrated circuits based on other materials. In other embodiments, the semiconductor materials of upper-tier wafers may be other than silicon, such as silicon germanium (SiGe), gallium arsenide (GaAs), indium phosphide (InP), gallium nitride (GaN), or other semiconductor. Moreover, the lower-tier wafer can be non-semiconductors such as insulative substrate materials. For example glass, quartz substrate, or even glass panel used in flat panel displays or sensors may be used as insulative substrate materials for the lower-tier wafer. Moreover, the MEMS bond release structure according to embodiments of the disclosure allows precise upper-tier wafer thinning and thickness control by controlling the thickness of the BOX layer for each tier, rather than by conventional mechanical grinding processes such as coarse and fine grinding, thus achieving a very small wafer total thickness variation (TTV).

Moreover, by avoiding the need for a conventional mechanical wafer grinding process, adverse effects on electrical properties of circuit elements in the upper tiers due to mechanical stress introduced during mechanical wafer grinding may be avoided. Furthermore, with the MEMS sacrificial layer release process, higher throughput in manufacturing of multi-tier 3D IC devices may be achieved because MEMS sacrificial layer release by etching may be faster than time-consuming mechanical grinding processes. By using the MEMS bond release structure according to embodiments of the disclosure in the manufacturing of 3D IC devices, lower material cost, higher yield and better material utilization may be achieved by avoiding waste of semiconductor materials and mechanical stress on the circuit elements resulting from conventional mechanical grinding processes.

While the foregoing disclosure describes illustrative embodiments, it should be noted that various changes and modifications could be made herein without departing from the scope of the appended claims. The functions, steps or actions in the method and apparatus claims in accordance with the embodiments described herein need not be performed in any particular order unless explicitly stated otherwise. Furthermore, although elements may be described or claimed in the singular, the plural is contemplated unless limitation to the singular is explicitly stated.

What is claimed is:

1. A microelectromechanical system (MEMS) bond release structure, comprising:
    a carrier wafer;
    a MEMS sacrificial release layer on the carrier wafer;
    a semiconductor oxide layer on the MEMS sacrificial release layer; and
    an active semiconductor layer on the semiconductor oxide layer,
    wherein the semiconductor oxide layer is in direct contact with a surface of an oxide layer and the MEMS sacrificial release layer is in direct contact with an opposite surface of the oxide layer,
    wherein the active semiconductor layer is doped,
    wherein there are no devices within the active semiconductor layer,
    wherein a surface of the active semiconductor layer is in direct contact with the semiconductor oxide layer, and
    wherein a doped portion of the active semiconductor layer is doped, the doped portion being a portion of the active semiconductor layer near the surface that is in direct contact with the semiconductor oxide layer.

2. The MEMS bond release structure of claim 1, wherein the semiconductor oxide layer comprises a silicon dioxide ($SiO_2$) layer.

3. The MEMS bond release structure of claim 2, wherein the active semiconductor layer comprises an active silicon layer on the $SiO_2$ layer.

4. The MEMS bond release structure of claim 1, comprising a plurality of MEMS posts spaced apart from one another, each of the plurality of MEMS posts comprising the MEMS sacrificial release layer.

5. The MEMS bond release structure of claim 4, wherein the MEMS sacrificial release layer comprises a material selected from the group consisting of molybdenum (Mo), germanium (Ge), germanium oxide ($GeO_x$) and silicon oxide ($SiO_x$).

6. The MEMS bond release structure of claim 4, wherein each of the plurality of MEMS posts further comprises the oxide layer on the MEMS sacrificial release layer for bonding the MEMS sacrificial release layer with the semiconductor oxide layer.

7. The MEMS bond release structure of claim 4, wherein the plurality of MEMS posts comprise one or more inner MEMS posts and one or more outer MEMS posts at least partially surrounding the one or more inner MEMS posts on the carrier wafer.

8. The MEMS bond release structure of claim 4, wherein the semiconductor oxide layer is continuous over the plurality of MEMS posts.

9. The MEMS bond release structure of claim 1, wherein the semiconductor oxide layer and the active semiconductor layer together form a buried oxide (BOX) layer.

10. The MEMS bond release structure of claim 1, wherein the doped portion is H+ delta doped.

11. A microelectromechanical system (MEMS) bond release structure, comprising:
    a carrier substrate comprising a carrier wafer, and a release composition on the carrier wafer; and
    a silicon-on-insulator (SOI) substrate on the carrier substrate, the SOI substrate comprising a semiconductor oxide layer and an active semiconductor layer on the semiconductor oxide layer,
    wherein the semiconductor oxide layer of the SOI substrate is in direct contact with the release composition of the carrier substrate,
    wherein the release composition does not comprise any active layer,
    wherein the release composition of the carrier substrate comprises:
        a sacrificial layer on the carrier wafer; and
        an oxide layer on the sacrificial layer such that the semiconductor oxide layer of the SOI substrate is in direct contact with the oxide layer,
    wherein the active semiconductor layer is doped,
    wherein there are no devices within the SOI substrate,
    wherein a surface of the active semiconductor layer is in direct contact with the semiconductor oxide layer, and
    wherein a doped portion of the active semiconductor layer is doped, the doped portion being a portion of the active semiconductor layer near the surface that is in direct contact with the semiconductor oxide layer.

12. The MEMS bond release structure of claim 11, wherein the sacrificial layer comprises a material selected from the group consisting of molybdenum (Mo), germanium (Ge), germanium oxide ($GeO_x$) and silicon oxide ($SiO_x$).

13. The MEMS bond release structure of claim 11, wherein the release composition of the carrier substrate comprises a plurality of MEMS posts spaced apart from one another on the carrier wafer such that the semiconductor oxide layer of the SOI substrate is in direct contact with the plurality of MEMS posts.

14. The MEMS bond release structure of claim 13, wherein each of the plurality of MEMS posts comprises the sacrificial layer on the carrier wafer.

15. The MEMS bond release structure of claim 14, wherein the sacrificial layer comprises a material selected from the group consisting of molybdenum (Mo), germanium (Ge), germanium oxide ($GeO_x$) and silicon oxide ($SiO_x$).

16. The MEMS bond release structure of claim 14, wherein each of the plurality of MEMS posts further comprises the oxide layer on the sacrificial layer.

17. The MEMS bond release structure of claim 13, wherein the plurality of MEMS posts comprise:
    one or more inner MEMS posts; and
    one or more outer MEMS posts at least partially surrounding the one or more inner MEMS posts.

18. The MEMS bond release structure of claim 13, wherein the semiconductor oxide layer is continuous over the plurality of MEMS posts.

19. The MEMS bond release structure of claim 11, wherein the doped portion is H+ delta doped.

* * * * *